United States Patent [19]
Restaino et al.

[11] Patent Number: 6,140,236
[45] Date of Patent: Oct. 31, 2000

[54] HIGH THROUGHPUT Al-CU THIN FILM SPUTTERING PROCESS ON SMALL CONTACT VIA FOR MANUFACTURABLE BEOL WIRING

[75] Inventors: Darryl Restaino, Modena; Chi-Hua Yang, Yorktown, both of N.Y.; Hans W. Poetzlberger, Munich, Germany; Tomio Katata, Yokohama, Japan; Hideaki Aochi, Fairfax, Va.

[73] Assignees: Kabushiki Kaisha Toshiba, Kawasaki, Japan; Siemens Microelectronics, Inc., Cupertino, Calif.; International Business Machines Corporation, Armonk, N.Y.

[21] Appl. No.: 09/063,094

[22] Filed: Apr. 21, 1998

[51] Int. Cl.[7] .................. H01L 21/4763; H01L 21/44
[52] U.S. Cl. .................. 438/687; 438/622; 438/625; 438/627; 438/628; 438/642; 438/643; 438/644; 438/688
[58] Field of Search .................. 438/688, 687, 438/669, 675, 652, 653, 629, 625, 637, 638, 639, 640, 642, 622, 627, 628, 643, 644, 648

[56] References Cited

U.S. PATENT DOCUMENTS

| | | | |
|---|---|---|---|
| 4,495,221 | 1/1985 | Broadbent | 427/88 |
| 4,721,689 | 1/1988 | Chaloux, Jr. et al. | 437/189 |
| 4,724,060 | 2/1988 | Sakata et al. | 204/298 |
| 4,790,920 | 12/1988 | Krzanich | 204/192.17 |
| 4,910,580 | 3/1990 | Kuecher et al. | 357/71 |
| 4,937,657 | 6/1990 | DeBlasi et al. | 357/71 |
| 5,071,714 | 12/1991 | Rodbell et al. | 428/620 |
| 5,106,781 | 4/1992 | Penning De Vries | 437/192 |
| 5,173,442 | 12/1992 | Carey | 437/173 |
| 5,175,125 | 12/1992 | Wong | 437/188 |
| 5,231,751 | 8/1993 | Sachdev et al. | 29/852 |
| 5,262,354 | 11/1993 | Cote et al. | 437/195 |
| 5,313,101 | 5/1994 | Harada et al. | 257/758 |
| 5,345,108 | 9/1994 | Kikkawa | 257/751 |
| 5,355,020 | 10/1994 | Lee et al. | 257/741 |
| 5,366,929 | 11/1994 | Cleeves et al. | 437/195 |
| 5,523,529 | 6/1996 | Merchant et al. | 437/190 |
| 5,527,741 | 6/1996 | Cole et al. | 437/209 |
| 5,580,823 | 12/1996 | Hedge et al. | 437/192 |
| 5,585,673 | 12/1996 | Joshi et al. | 257/751 |
| 5,597,458 | 1/1997 | Sanchez, Jr. et al. | 204/192.3 |
| 5,658,828 | 8/1997 | Lin et al. | 438/643 |
| 5,895,265 | 4/1999 | Inoue et a. | 438/643 |
| 5,985,751 | 10/1999 | Koyama | 438/637 |

OTHER PUBLICATIONS

B. Vollmer et al. "Recent Advances in the Application of Collimated Sputtering", Thin Solid Films, vol. 247 (1994), pp. 104–111.

N. Motegi et al. "Long–Throw Low–Pressure Sputtering Technology for Very Large–Scale Integrated Devices" Journal of Vacuum Science and Technology, vol. B 13(4), Jul./Aug. 1995, pp. 1906–1909.

S.M. Rossnagel et al. "Collimated Magnetron Sputtering Deposition", Journal of Vacuum Science and Technology, vol. A 9(2), Mar./Apr. 1991, pp. 261–265.

*Primary Examiner*—Charles Bowers
*Assistant Examiner*—Thanhha Pham
*Attorney, Agent, or Firm*—Banner & Witcoff, Ltd.

[57] ABSTRACT

A metal interconnect layer that fills in a via hole formed by first depositing a first Al—Cu film on the sidewalls of the via hole at a low temperature and a low sputtering power and then depositing a second Al—Cu film on the first Al—Cu film at a high temperature and high sputtering power. Sputtering is performed in two steps at low and high temperatures within the same sputtering chamber. The deposition at low temperature and low sputtering power provides good coverage in the via hole, and the deposition at high temperature and high sputtering power reduces the process time.

15 Claims, 2 Drawing Sheets

HIGH THROUGHPUT Al-CU THIN FILM SPUTTERING PROCESS ON SMALL CONTACT VIA FOR MANUFACTURABLE BEOL WIRING

BACKGROUND OF THE INVENTION

The invention relates to a method for manufacturing a large-scale-integration semiconductor device and more particularly to a process of depositing an Al—Cu thin film in small via holes at a high throughput.

With large-scale-integration semiconductor devices, for example, current 256 Mb DRAMs, it is required to fill in a very small via hole for the formation of the second level (the topmost layer) of multilevel inter-connections. An Al—Cu sputtering process, which allows the second level of inter-connection and contact between the first and second levels of interconnections to be formed in one step, can reduce both the process time and cost and thus has been employed in the BEOL (Back End of Line) wiring process for 64-Mb DRAMs and CMOS logic circuits.

With 256-Mb DRAMs, however, the via hole size is scaled down to less than 0.8 $\mu$m. It is therefore impossible for the conventional Al—Cu sputtering process to completely fill in the via hole without leaving a void. The void significantly reduces the metal line reliability. Early failures are observed on all hardware in reliability tests in which current and temperature are applied to the second level of metal and the contact between the first and second levels of metal. Since high-temperature (above 450° C.) hot reflow process cannot be carried out on the topmost layer of metal in particular, the void is difficult to remove by means of post-treatment as well.

As techniques for filling in small and high-aspect-ratio via holes to form interconnect layers while suppressing the formation of the void, long throw sputtering and collimated sputtering are known. The long throw sputtering is a process which deposits a film of metal onto the bottom of a deep via hole by making the target-to-wafer distance long to decrease the horizontal components of metal particles that arrive at the wafer. The long throw sputtering process is described, for instance, in Journal of Vacuum Science and Technology B Vol. 13(4) (1995) p.1906 N. Motegi et al. In comparison with the collimated sputtering process, the long throw sputtering process has advantages that a relatively high sputtering rate and a good target efficiency can be achieved.

On the other hand, the collimated sputtering is a process which uses a collimator placed between the target and the wafer and thereby allows only vertical components of metal particles from the target to pass through the collimator and reach the bottom of the deep contact hole. This collimated sputtering process is described, for example, in U.S. Pat. No. 4,724,060, Journal of Vacuum Science and Technology A Vol. 9(2) (1991) p. 261 S. M. Rossnagel et al., and Thin Solid Films Vol. 247 (1994) p.104 B. Vollmer et al. The collimated sputtering process has good center-edge uniformity.

In the process of depositing the second level (the top layer) of metal for 256-Mb DRAMs, the long throw sputtering by which an Al—Cu thin film is deposited at a low temperature of about 150° C. in a long time or the collimated sputtering is used. Both the long throw sputtering and collimated sputtering processes can fill in the via hole without leaving a void and pass the reliability test.

However, the long throw sputtering and collimated sputtering processes employ only vertical components of metal particles emitted from the target and thus require a long time to deposit a metal film as compared with the usual sputtering process. In order to deposit an Al—Cu film having a thickness of the order of 1 $\mu$m, a deposition time of six to seven minutes is required. For this reason, the wafer throughput becomes low as compared with the case where the usual sputtering process is used, leading to an increase in manufacturing cost. In addition, with the collimated sputtering, metal is also deposited onto the collimator, so that the collimator often clogs. The collimator clogging varies the sputtering rate. In such a case, the collimator must be replaced with a new one and the downtime due to collimator replacement further reduces the throughput.

BRIEF SUMMARY OF THE INVENTION

It is therefore an object of the invention to provide a semiconductor device manufacturing method which permits throughput to be improved while suppressing the formation of a void and the manufacturing cost to be reduced.

The object is attained by a semiconductor device manufacturing method comprising: a first step of forming an insulating film over a surface of a semiconductor substrate; a second step of forming an opening in the insulating film; a third step of forming a first layer of metal on the insulating film and in the opening at a first temperature with the semiconductor substrate placed in a chamber of sputtering equipment; and a fourth step of forming a second layer of metal on the first layer of metal at a second temperature higher than the first temperature with the semiconductor substrate placed in the chamber of the sputtering equipment.

According to the manufacturing method, the first metal layer is formed at the first temperature (low temperature) to provide good coverage of the small via hole and the second metal layer is formed at the second temperature (high temperature) to provide a deposition rate. The metal layer that fills in the opening is efficiently formed in a short time while suppressing the formation of a void. Thus, since conventional sputtering equipment can be used to form a metal layer, the problems encountered in using the long throw sputtering and the collimator sputtering can be eliminated, ensuring high throughput and low cost without leaving a void.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The semiconductor device manufacturing method of the invention uses conventional sputtering equipment and its sputtering process is implemented by more than one step to deposit thin films made of metal within the same chamber while controlling three important parameters: the in-chamber pressure, the flow rate of a backside Ar gas, and the sputtering power. The wafer temperature is controlled by turning the backside Ar gas on or off and the deposition rate is controlled by changing the sputtering power. First, an Al—Cu film of several hundreds of nm in thickness is deposited at a low temperature below 150° C. and a low sputtering power with the backside Ar gas turned off. Next, the wafer is heated at a heater temperature of 350° C. with the backside Ar gas supplied and an Al—Cu film is then deposited at a high deposition rate based on a high sputtering power. As a result, two types of metal thin films consisting of low- and high-temperature metal particles are formed in sequence. The low-temperature, low-sputtering-power process provides good coverage in via holes but requires a long deposition time. On the other hand, the high-temperature, high-sputtering-power process can reduce the deposition time but provides poor coverage in the via holes. Thus, the two processes are used in combination. That is, the low-temperature low-sputtering-power process is first carried out to fill in part of the via hole and the high-temperature high-sputtering-power process is then performed to form a metal thin film, thereby ensuring good coverage in the via holes and reducing the deposition time. Moreover, the Al—Cu deposition chamber in the conventional sputtering equipment can be used to satisfy the 256-Mb DRAM requirement of having small via holes filled in and ensure sufficient reliability. Thus, high-quality BEOL wiring can be formed without sacrificing productivity and manufacturing cost.

Next, an application of the above-described sputtering process to the formation of interconnects in semiconductor devices will be described.

FIGS. 1A through 1D illustrate steps of manufacture of a semiconductor device in accordance with the present invention, particularly steps of forming the first and second levels of interconnects.

Figure 1A:
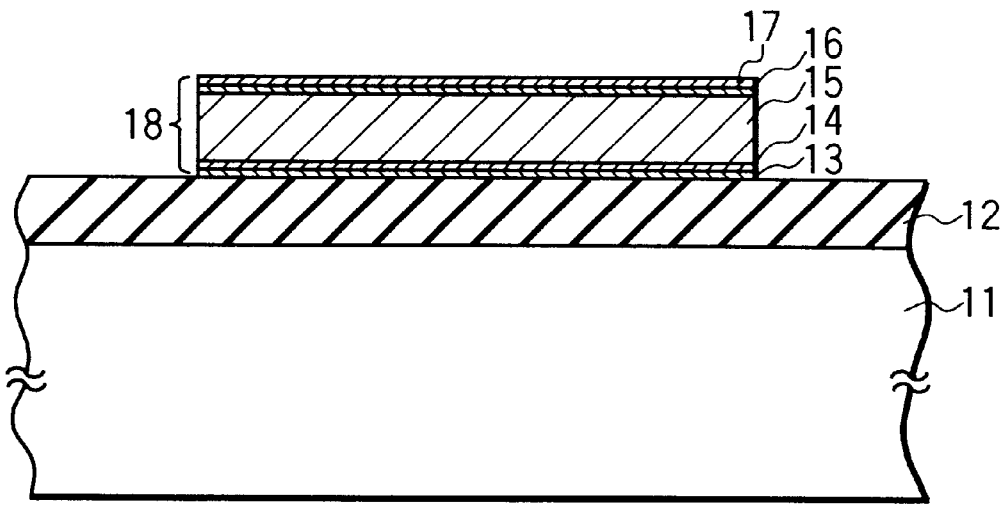
FIGS. 1A through 1D are cross-sectional views in the order of steps of forming the first level and the second level of metal interconnections in accordance with an embodiment of the present invention.

First, as shown in FIG. 1A, by means of sputtering, a Ti film 13, a TiN film 14, an Al—Cu film 15, a Ti film 16 and a TiN film 17 are formed in sequence onto an insulating layer 12 formed over a surface of a semiconductor substrate 11. By means of lithography and RIE techniques, those films are patterned to form a first layer (M1) 18 of metal interconnect. For example, the Ti film 13, the TiN film 14, the Al—Cu film 15, the Ti film 16 and the TiN film 17 are 10 nm, 10 nm, 230 nm, 5 nm, and 40 nm, respectively, in thickness. After that, sinter annealing is carried out in a forming gas at 400° C. for 20 minutes.

Figure 1B:
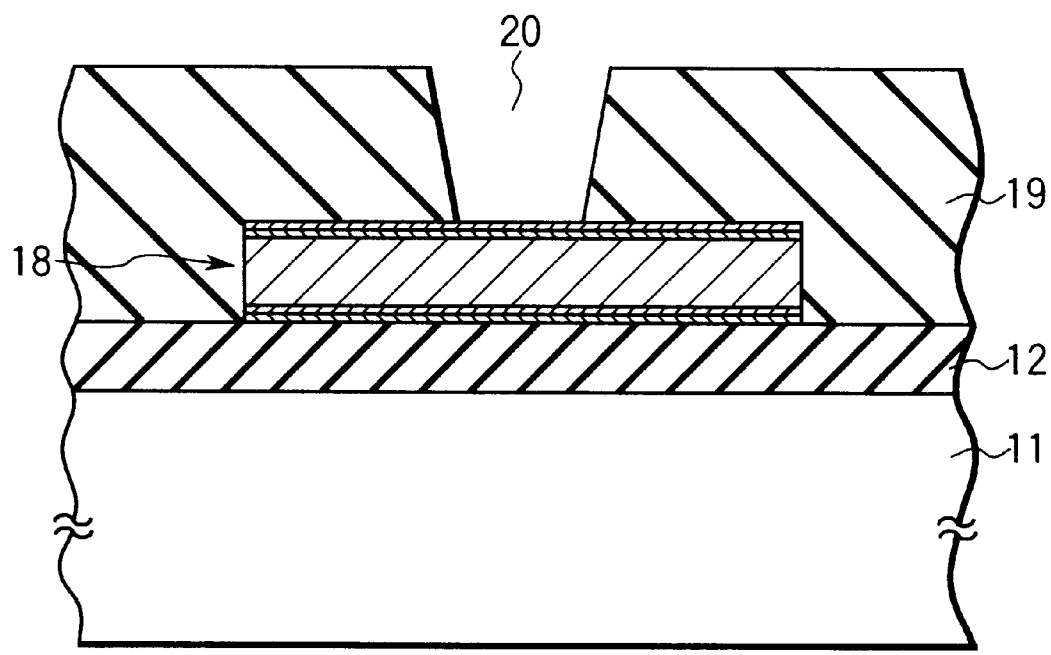

Next, as shown in FIG. 1B, an interlayer insulating film 19 of 600 nm in thickness is formed on the first metal interconnect layer 18 and the insulating film 12 and an opening (via hole) 20 is then formed in the interlayer insulating film 19 by means of lithographic and RIE techniques.

Figure 1C:
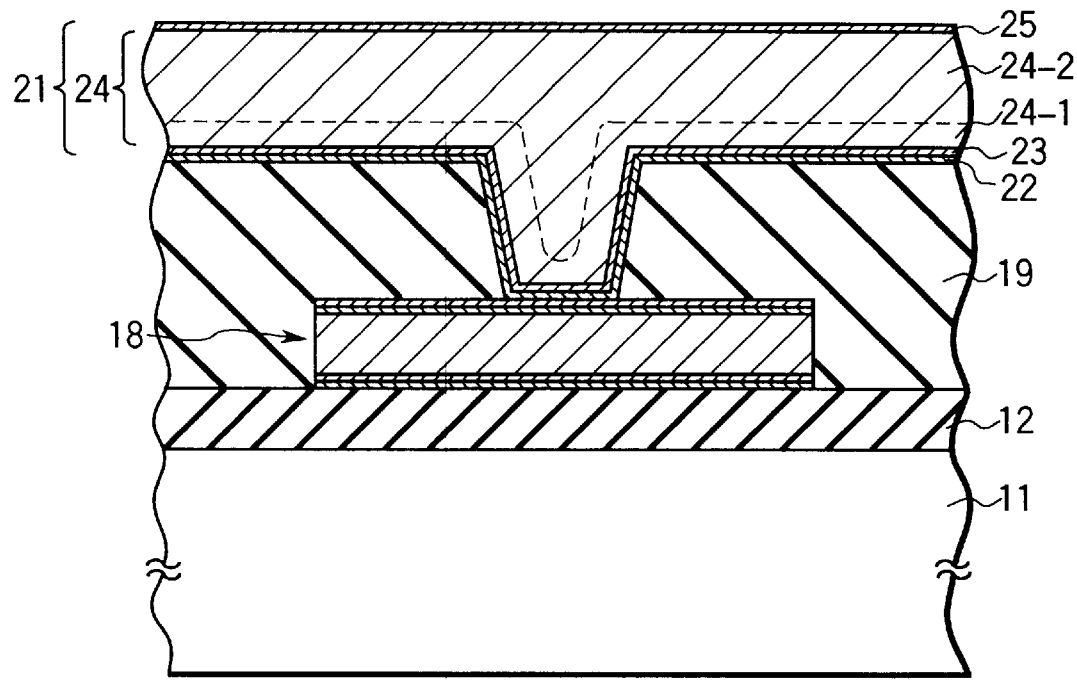

Next, as shown in FIG. 1C, a second metal interconnect layer (M2) 21 is formed on the interlayer insulating film 19 and in the via hole 20. For the formation of the second metal interconnect layer 21, a Ti film 22 of 25 nm in thickness and a TiN film 23 of 25 nm in thickness are first formed in sequence in a Ti/TiN sputtering chamber and then, in an Al sputtering chamber having its heater temperature set at 150° C., Al—Cu is sputtered for 55 seconds at a low sputtering power of 3.2 kW with no flow of wafer backside heating Ar gas. In this case, an Al—Cu film 24-1 of 300 nm in thickness was formed at a low temperature (which may be 50° C. or room temperature much lower than 150° C.). In this case, in the absence of backside Ar gas flow even with the heater temperature set at 350° C., the wafer temperature will be below 150° C. because the thermal conductivity between the heater and the wafer is poor, leading to a similar result. According to this method, the time required to raise the heater temperature is further reduced. After that, the heating Ar gas is introduced for 45 seconds to heat the wafer up to 350° C. Al—Cu is then sputtered at a high sputtering power of 12.7 kW for 32 seconds with heating Ar gas flow. Thus, an Al—Cu film 24-2 of 700 nm is formed at high temperature. As a result, an Al—Cu film 24 having a total thickness of 1 μm is formed. After that, a TiN film 25 is formed at a thickness of 37.5 nm in the Ti/TiN sputtering chamber.

Figure 1D:
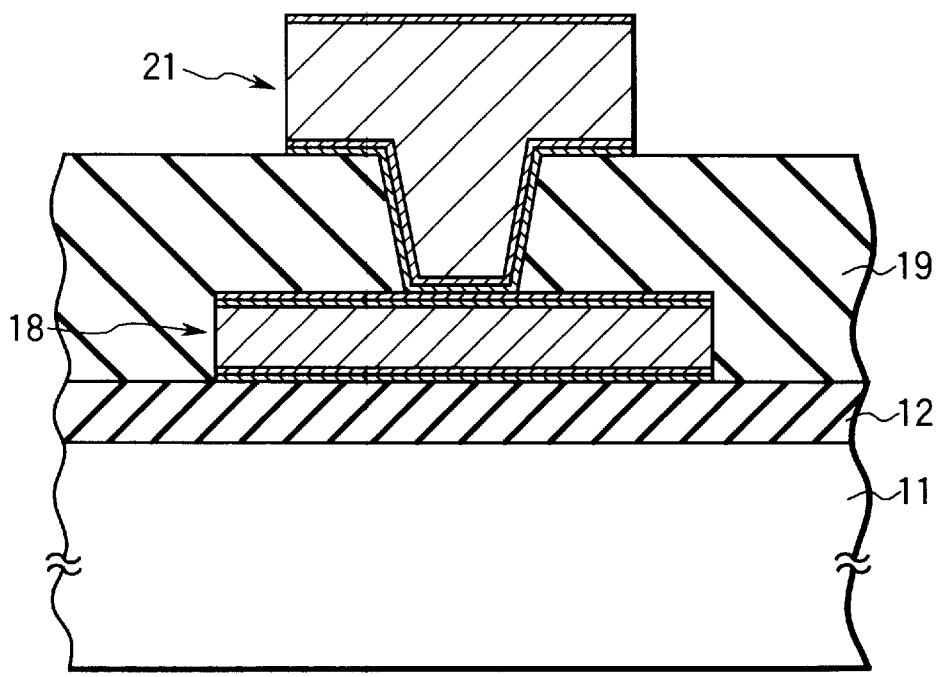

Next, as shown in FIG. 1D, the second metal interconnect layer 21 is patterned by means of lithography and RIE techniques, thereby completing the multilevel wiring process.

According to the manufacturing method described above, the via hole 20 is filled in by the Al—Cu film 24-1 formed at low temperature to provide good coverage and then the Al—Cu film 24-2 is formed at high temperature to provide high deposition yield. Therefore, the second metal interconnect layer 21 can be formed in a short time while suppressing the formation of a void in the via hole 20. Thus, the problems encountered in using the long throw sputtering or the collimated sputtering can be eliminated, ensuring high throughput and low cost. More specifically, the long throw sputtering and the collimated sputtering require six to seven minutes to form a metal interconnect layer of 1 μm in thickness, while the above-described inventive method can form a metal interconnect layer of the same thickness in less than three minutes, significantly improving the throughput. Moreover, unlike the collimated sputtering, the inventive method does not suffer from an increase in cost due to consumable parts and down time due to consumable part replacement. From these points of view as well, the inventive method can reduce cost and improve throughput.

The inventors formed via contact between first and second levels of interconnects for 256-Mb DRAM BEOL wiring in accordance with various manufacturing methods and performed stress tests. The second level of interconnect consists of a Ti film of 25 nm in thickness, a TiN film of 25 nm in thickness, an Al—Cu film of 1 μm in thickness, and a TiN film of 37.5 nm in thickness which were stacked in the order mentioned. The Al—Cu film was formed in accordance with the following methods:

(a) Sputtering using standard sputtering equipment with the temperature in the chamber set at 350° C.

(b) Sputtering in multiple steps in accordance with the present invention.

(c) Long throw sputtering with the temperature in the chamber set at 150° C.

(d) Collimated sputtering.

A chip is defined to be defective when it shows an increase of 20% in contact resistance under conditions of a test temperature of 245° C. and a current flow of 11.00 mA between the first and second levels of interconnects. Then, early failures (which occur within five hours from the start of testing) were observed on six chips of 50 chips for the via contact made in accordance with the method (a). No early failures were observed on 50 chips manufactured in the accordance with each of the methods (b), (c), and (d). The method (b) is less than three minutes in the required process time, while the methods (c) and (d) each need six to seven minutes because the Al—Cu film deposition rate is low.

The cost of manufacturing a semiconductor device in accordance with the present invention is reduced drastically by reducing the process time. The cost of consumable parts can also be reduced because there is no need of collimator replacement and moreover the frequency of target replacement is low.

The embodiment of the present invention has been described in terms of an example of turning the backside Ar gas on and off in the sputtering equipment to change the conductivity of heat generated by the heater. This is not restrictive. The thermal conductivity between the heater and the wafer may likewise be changed by turning the electrostatic chuck of the sputtering equipment on and off. Further, in order to form the Al—Cu film 24 of 1 µm, the above-described embodiment has been described as first depositing the Al—Cu film 24-1 of 300 nm in thickness at low temperature and low sputtering power and then depositing the Al—Cu film 24-2 of 700 nm in thickness at higher temperature and higher sputtering power. It should however be noted that the thickness of the Al—Cu film formed at low temperature and low sputtering power may be in a range from 300 to 700 nm, and the Al—Cu film deposited at high temperature and high sputtering power may be in a range from 700 to 300 nm. If the thickness of the Al—Cu film deposited at low temperature and low sputtering power were less than 300 nm, then the void suppressing effect would be lessened. If, on the other hand, the thickness were greater than 700 nm, the sputtering time would increase. Thus, it is required to determine the thickness of each Al—Cu film and the sputtering power taking into account the size and depth of the via hole, the required coverage in the via hole, and the manufacturing time.

According to the present invention, as described above, there is provided a semiconductor device manufacturing method which can improve throughput and reduce manufacturing cost while suppressing the formation of voids.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:

a first step of forming an insulating film over a surface of a semiconductor substrate;

a second step of forming an opening in the insulating film;

a third step of forming a first layer of metal by using a material containing at least one of aluminum and copper as a main component, on the insulating film and in the opening at a first deposition rate, at a first temperature, and at a first sputtering power, with the semiconductor substrate placed in a single chamber of a sputtering equipment; and a fourth step of forming a second layer of metal by using the material containing at least one of aluminum and copper as a main component, on the first layer of metal directly after said third step, at a second deposition rate greater than the first deposition rate, at a second temperature greater than the first temperature, and at a second sputtering power greater than the first sputtering power, in the single chamber of the sputtering equipment.

2. The method according to claim 1, in which the second sputtering power is approximately four times greater than the first sputtering power.

3. The method according to claim 1, in which a difference between the first temperature and the second temperature is produced by changing the conductivity of heat generated by a heater provided in the chamber of the sputtering equipment.

4. The method according to claim 3, in which the conductivity of heat generated by the heater is changed by turning a backside Ar gas in the sputtering equipment off during the third step and turning the backside Ar gas on during the fourth step.

5. The method according to claim 3, in which the conductivity of heat generated by the heater is changed by turning an electrostatic chuck of the sputtering equipment off during the third step and turning the electrostatic chuck on during the fourth step.

6. The method according to claim 1, in which the first temperature is lower than 150° C., and the second temperature is in a range from 300 to 400° C.

7. The method according to claim 1, further comprising a fifth step of forming a first barrier metal layer between the second and third steps and a sixth step of forming a second barrier metal layer on the second layer of metal subsequent to the fourth step.

8. The method according to claim 7, further comprising a seventh step of forming an interconnect layer above the semiconductor substrate prior to the first step, and in which the insulating film is formed on the interconnect layer, and the opening is formed in that portion of the insulating film which is located above the interconnect layer.

9. The method according to claim 8, in which the seventh step comprises a step of forming a third barrier metal layer on the semiconductor substrate, a step of forming a third metal layer on the third barrier metal layer, a step of forming a fourth barrier metal layer on the third metal layer, and a step of patterning the third barrier metal layer, the third metal layer, and the fourth barrier metal layer.

10. The method according to claim 9, further comprising a step of forming a fifth barrier metal layer in the opening between the fourth barrier metal layer and the first barrier metal layer.

11. The method according to claim 10, in which each of the first through fifth barrier metal layers contains a refractory metal.

12. The method according to claim 9, in which each of the first through fourth barrier metal layers contains titanium nitride.

13. The method according to claim 9, in which each of the first through fourth barrier metal layers contains stacked layers of titanium and titanium nitride.

14. The method according to claim 10, in which the fifth barrier metal layer contains titanium.

15. A semiconductor device manufacturing method comprising:

a first step of forming an insulating film over a surface of a semiconductor substrate;

a second step of forming an opening in the insulating film;

a third step of forming a first layer of metal by using a material containing at least one of aluminum and copper as a main component, on the insulating film and in the opening at a first deposition rate, at a first temperature, and at a first sputtering power, with the semiconductor substrate placed in a single chamber of a sputtering equipment; and a fourth step of forming a second layer of metal by using the material containing at least one of aluminum and copper as a main component, contiguous with the first layer of metal, at a second deposition rate greater than the first deposition rate, at a second temperature greater than the first temperature, and at a second sputtering power greater than the first sputtering power, in the single chamber of the sputtering equipment.

* * * * *